US008236696B2

(12) United States Patent
Cho

(10) Patent No.: US 8,236,696 B2
(45) Date of Patent: Aug. 7, 2012

(54) TRANSISTOR AND METHOD FOR FABRICATING THE SAME

(75) Inventor: Jun-Hee Cho, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/965,708

(22) Filed: Dec. 27, 2007

(65) Prior Publication Data

US 2008/0230832 A1   Sep. 25, 2008

(30) Foreign Application Priority Data

Mar. 19, 2007   (KR) .................. 10-2007-0026514

(51) Int. Cl.
*H01L 29/78* (2006.01)
*H01L 21/306* (2006.01)

(52) U.S. Cl. ......... 438/696; 257/E29.255; 257/E21.219; 257/327

(58) Field of Classification Search .................. 257/639, 257/327; 438/696
See application file for complete search history.

(56) References Cited

U.S. PATENT DOCUMENTS

| | | | |
|---|---|---|---|
| 6,787,854 | B1 | 9/2004 | Yang et al. |
| 6,812,119 | B1 | 11/2004 | Ahmed et al. |
| 2001/0048115 | A1* | 12/2001 | Yamazaki et al. ............ 257/154 |
| 2005/0070089 | A1* | 3/2005 | Iinuma ........................ 438/626 |
| 2005/0142766 | A1* | 6/2005 | Hareland et al. ............ 438/268 |
| 2005/0263821 | A1* | 12/2005 | Cho et al. ..................... 257/347 |
| 2005/0282342 | A1 | 12/2005 | Adan |
| 2006/0172519 | A1* | 8/2006 | Yang et al. ................... 438/592 |
| 2006/0264033 | A1* | 11/2006 | Olmen et al. ................ 438/637 |
| 2007/0205459 | A1* | 9/2007 | Cho et al. ..................... 257/321 |
| 2008/0157201 | A1* | 7/2008 | Marshall ...................... 257/350 |

FOREIGN PATENT DOCUMENTS

| KR | 1020050006836 A | 1/2005 |
|---|---|---|
| KR | 1020060020021 A | 3/2006 |
| KR | 1020070090375 A | 9/2007 |

OTHER PUBLICATIONS

Ahmed et al., The effects of trichloroethane HCL and ion-implantation on the oxidation rate of silicon, Journal of Materials Science 29 (1994) 184-188.*
Korean Intellectual Property Office, Notice of Preliminary Rejection, Application No. 10-2007-0026514, Mar. 25, 2008.
Moselund et al., "Cointegration of Gate-All-Around MOSFETs and Local Silicon-on-Insulator Optical Waveguides on Bulk Silicon," *IEEE Trans. Nanotechnol.* 6:118-124 (2007).

* cited by examiner

*Primary Examiner* — Zandra Smith
*Assistant Examiner* — Lawrence Tynes, Jr.
(74) *Attorney, Agent, or Firm* — Kilpatrick Townsend & Stockton LLP

(57) ABSTRACT

A method for fabricating a semiconductor device to enlarge a channel region is provided. The channel region is enlarged due to having pillar shaped sidewalls of a transistor. The transistor includes a fin active region vertically protruding on a substrate, an isolation layer enclosing a lower portion of the fin active region, and a gate electrode crossing the fin active region and covering a portion of the fin active region. An isolation layer is formed enclosing a lower portion of the fin active region and the isolation layer under the spacers is partially removed to expose a portion of the sidewalls of the fin active region. Subsequently, dry etching is performed to form the sidewalls having a pillar/neck.

16 Claims, 7 Drawing Sheets

US 8,236,696 B2

TRANSISTOR AND METHOD FOR FABRICATING THE SAME

CROSS-REFERENCE TO RELATED APPLICATIONS

The present invention claims priority of Korean patent application number 10-2007-0026514, filed on Mar. 19, 2007, which is incorporated by reference in its entirety.

BACKGROUND OF THE INVENTION

The present invention relates to a method for fabricating a semiconductor device, and more particularly, to a method for forming a transistor in a semiconductor device.

As semiconductor devices become highly integrated, a size of the semiconductor devices become decreased. Thus, there are limitations such as increasing of a junction leakage and an electric field and a short channel effect as a doping concentration to a substrate increases.

A fin electric field effect transistor (hereinafter, a fin transistor) has been suggested to overcome the above limitations. In the fin transistor, a sufficient amount of current may be obtained by enlarging the channel region by having it at least promptly protrude vertically from the substrate.

A method for fabricating a typical fin transistor structure will be described hereinafter referring to FIGS. 1 to 2C.

FIG. 1 illustrates a perspective view of the typical fin transistor structure. A substrate 11 includes a vertically protruding fin active region 11A and an isolation layer 12. The fin active region 11A is divided into an upper portion and a lower portion with respect to a surface of the isolation layer 12. The isolation layer 12 encloses sidewalls of the lower portion of the fin active region 11A. A gate electrode 13 crossing the fin active region 11A is formed over the substrate 11 having the isolation layer 12. As shown, the gate electrode 13 covers a portion of the upper portion of the fin active region 11A and a channel region is formed along the portion of the fin active region 11A covered with the gate electrode 13. Since three sides of the fin active region 11A covered with the gate electrode 13 may be used as a channel, the channel region can be increased. Reference symbols S and D represent a source region and a drain region, respectively.

FIGS. 2A to 2C illustrate cross-sectional views of a method for fabricating the typical fin transistor along the line A-A' shown in FIG. 1. The same or like reference numerals in FIGS. 2A to 2C corresponding to FIG. 1 will be used.

Referring to FIG. 2A, a trench t is formed on an isolation target region in the substrate 11 in order to form a vertically protruding fin active region 11A. Then, the isolation layer 12 is formed in the trench t.

Referring to FIG. 2B, the isolation layer 12 is selectively etched to leave a given thickness by a dry etching or a wet etching process in order to expose the upper portion of the fin active region 11A. A reference numeral 12A represents the isolation layer 12 after performing the dry etching or the wet etching process.

Referring to FIG. 2C, after forming a gate insulation layer (not shown) along the portion of an exposed upper portion of the fin active region 11A, a conductive layer for a gate electrode is formed over the etched isolation layer 12A and the gate insulation layer. A gate electrode 13 that crosses the fin active region 11A and also covers the fin active region 11A is formed by patterning the conductive layer. Subsequently, a channel region c is formed along the portion of the surface of the fin active region 11A that is covered by the gate electrode 13. Thus, a sufficient amount of current may be obtained due to the channel region enlarged by the method described hereinbefore. However, as semiconductor devices become more highly integrated, there is a need to further enlarge a surface area of the channel region of the semiconductor devices.

SUMMARY OF THE INVENTION

The present invention is directed to provide a method for fabricating a semiconductor device, and more particularly, to a method for fabricating a transistor in a semiconductor device, which enlarges a channel region of the transistor where the sidewalls of the transistor have a pillar.

In accordance with an aspect of the present invention, there is provided a transistor in a semiconductor device. The transistor includes a fine active region vertically protruding on a substrate, an isolation layer enclosing a lower portion of the fin active region, and a gate electrode crossing the fin active region and covering the fin active region. The sidewalls of the fin active region have a concave shape.

In accordance with another aspect of the present invention, there is provided a method for fabricating a transistor in a semiconductor device. The method includes forming a trench by partially etching a substrate, thereby forming a fin active region vertically protruding. An isolation layer is formed by enclosing a lower portion of the fin active region. The method further includes forming spacers on sidewalls of the fin active region, partially removing the isolation layer under the spacers to expose a portion of the sidewalls of the fin active region, thereby forming a resultant structure, and performing a dry etching on the resultant structure to form the sidewalls of the fin active region having a pillar.

DESCRIPTION OF SPECIFIC EMBODIMENTS

FIGS. 3A to 3F illustrate cross-sectional views of a method for fabricating a transistor in accordance with an embodiment of the present invention.

Figure 1:
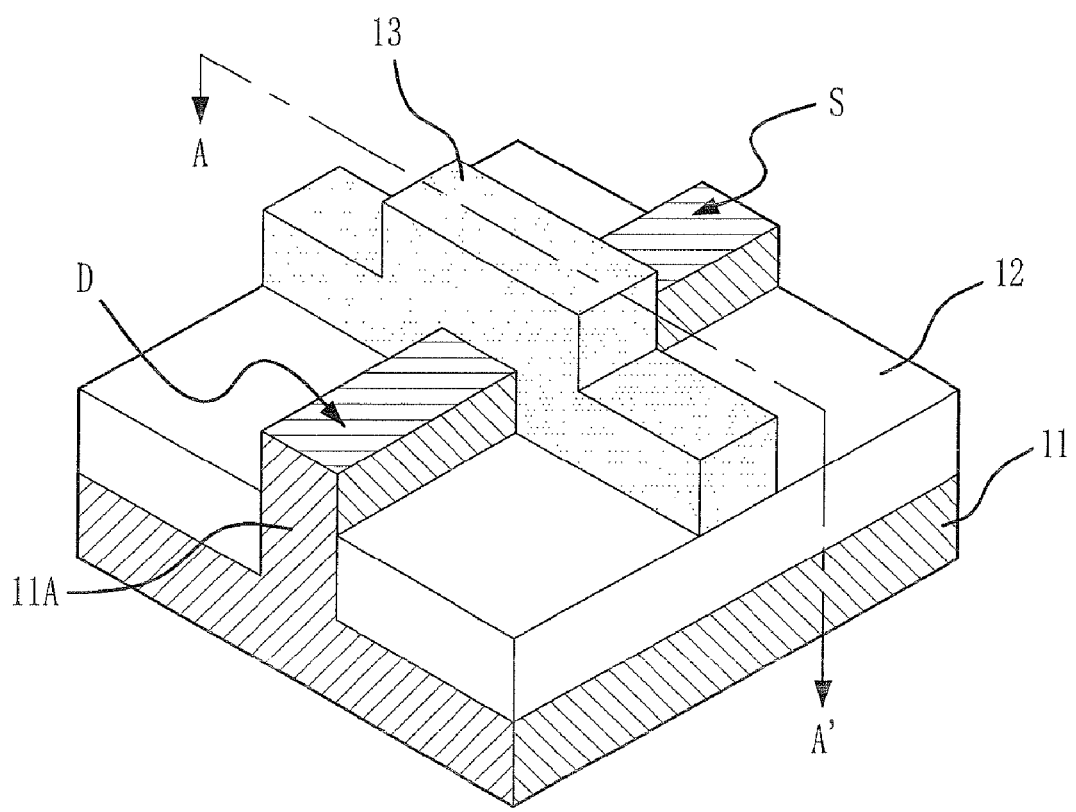
FIG. 1 illustrates a perspective view of a typical transistor in a semiconductor device.
Figure 2A:
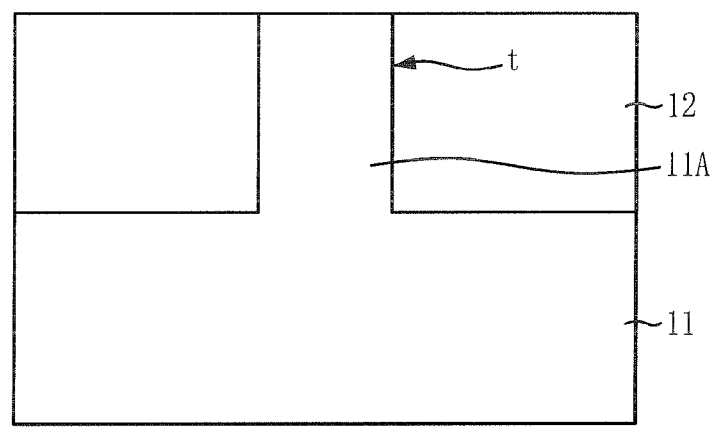
FIGS. 2A to 2C illustrate cross-sectional views of a method for fabricating the typical transistor in a semiconductor device.
Figure 2B:
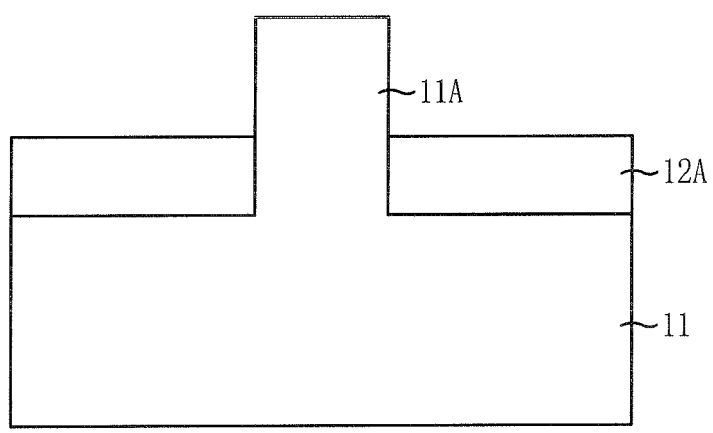
Figure 2C:
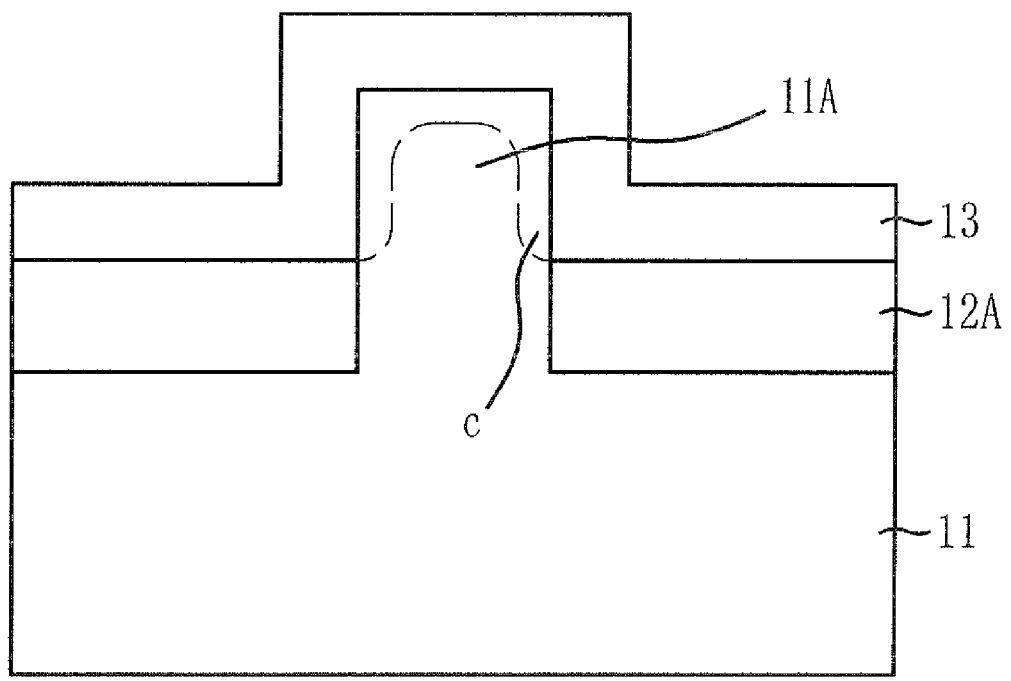
Figure 3A:
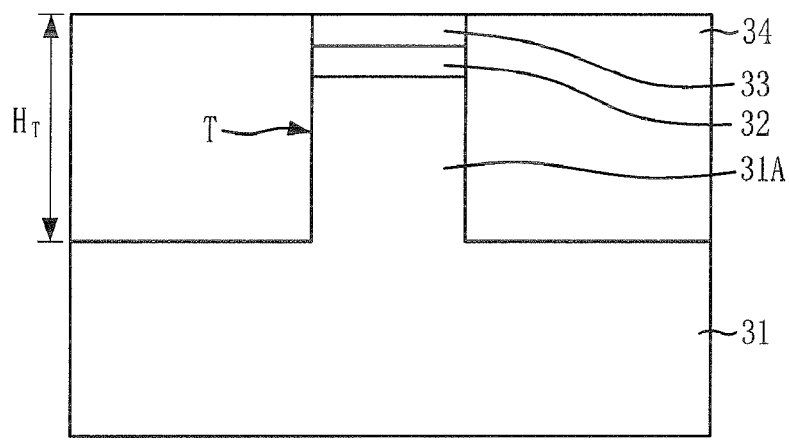
FIGS. 3A to 3F illustrate cross-sectional views of a method for fabricating a transistor in accordance with an embodiment of the present invention.

Referring to FIG. 3A, a fin active region 31A vertically protruding is formed by forming a trench T on an isolation target region on a substrate 31. An oxide layer and a nitride layer are successively formed over the substrate 31 prior to forming the trench T. Then, a photoresist pattern (not shown) is formed over the nitride layer. The nitride layer, the oxide layer, and the substrate 31 are selectively etched by using the photoresist pattern, thus forming the trench T and the fin active region 31A. As shown in FIG. 3A, reference numerals 32 and 33 represent a pad oxide layer and a pad nitride layer, respectively, after selective etching on the nitride layer and the oxide layer.

In one embodiment, the photoresist pattern includes a cycloolefin-maleic anhydride (COMA) type or an acrylate type polymer. In that embodiment, the photoresist pattern may be formed by an etching process using an argon-fluor (ArF) as an exposure source and may be formed with having a bar shape or a T-shape in a planar view. An anti-reflection layer (not shown) may be formed under a bottom of the photoresist pattern. The anti-reflection layer may include an organic material. In one embodiment, a depth HT of the trench ranges from approximately 1,000 Å to approximately 2,000 Å.

A material layer for isolation is formed over the substrate 31 having the trench T, and then an isolation layer 34 filling in the trench T is formed by performing a chemical mechanical polishing (CMP) process to expose a surface of the pad nitride layer 33.

Figure 3B:
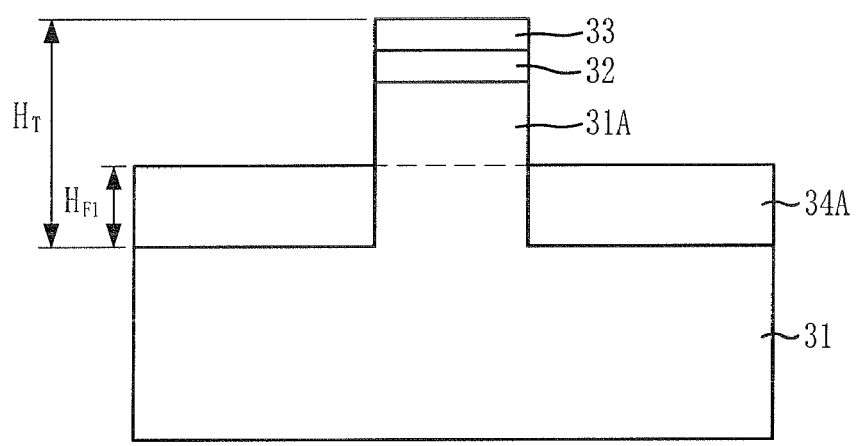

Referring to FIG. 3B, the isolation layer 34 is selectively etched to have a given thickness $H_{F1}$. An etched isolation layer 34A remains after the selective etching process. The fin active region 31A is divided into an upper portion and a lower portion as defined by the upper surface of the etched isolation layer 34A. That is, the lower portion has a height of $H_{F1}$. The etched isolation layer 34A encloses sidewalls of the lower portion of the fin active region 31A.

Figure 3C:
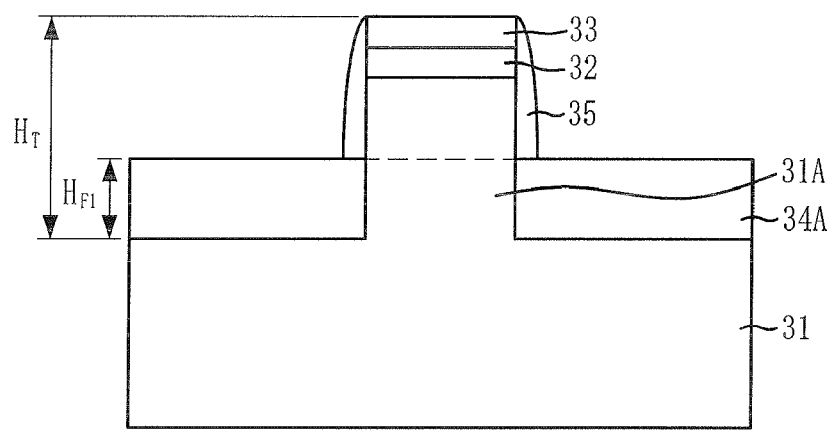

Referring to FIG. 3C, spacers 35 are formed on sidewalls of the pad oxide layer 32, the pad nitride layer 33 and the upper portion of the active region 31A. A material layer for a spacer is formed over a first resultant structure that includes the pad oxide layer 32, the pad nitride layer 33 and the upper portion of the active region 31A. Subsequently, a spacer etching process is performed on the material layer to form the spacers 35. In one embodiment, the spacers 35 include a nitride layer and the spacers 35 have a thickness ranging from approximately 5 nm to approximately 50 nm.

The spacer etching process is performed; at a source power ranging from approximately 200 W to approximately 3,000 W; at a bias power ranging from 0 W to approximately 1,500 W; at a pressure ranging from approximately 3 mTorr to approximately 100 mTorr; at a temperature ranging from approximately 10° C. below zero to approximately 50° C. Furthermore, the etching process is performed using a gas mixture of $C_XF_Y$, argon (Ar), oxygen ($O_2$), nitrogen ($N_2$), wherein the $C_XF_Y$ gas flows ranging from approximately 10 sccm to 100 sccm; the Ar gas flows ranging from approximately 10 sccm to approximately 300 sccm; the $O_2$ gas flows from 0 sccm to approximately 50 sccm; the $N_2$ gas flows ranging 0 sccm to approximately 100 sccm. In the meantime, the X of the $C_XF_Y$ gas ranges from 1 to 10 and the Y of the $C_XF_Y$ gas ranges from 1 to 10.

Figure 3D:
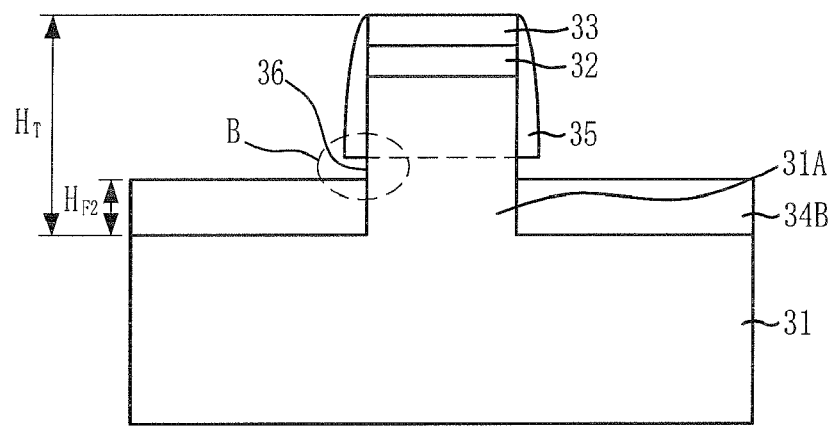

Referring to FIG. 3D, as a wet cleaning process or wet etching is performed on the etched isolation layer 34A using the pad nitride layer 33 and the spacers 35 as an etch barrier, the etched isolation layer 34A under the spacers 35 is slightly removed. A reference numeral 34B represents the etched isolation layer 34A after the wet cleaning process. Thus, a remaining etched isolation layer 34B has a lower thickness than the $H_{F1}$. The lower thickness of the remaining etched isolation layer 34B is represented as $H_{F2}$ ($<H_{F1}$). A thickness difference between $H_{F1}$ to $H_{F2}$ ranges from approximately 10 nm to approximately 100 nm. A portion 36 of sidewalls of the lower portion of the fin active region 31A is exposed, referring to a section B in FIG. 3D. In another embodiment, one or more dry etching process may be used to expose the portion 36.

Figure 3E:
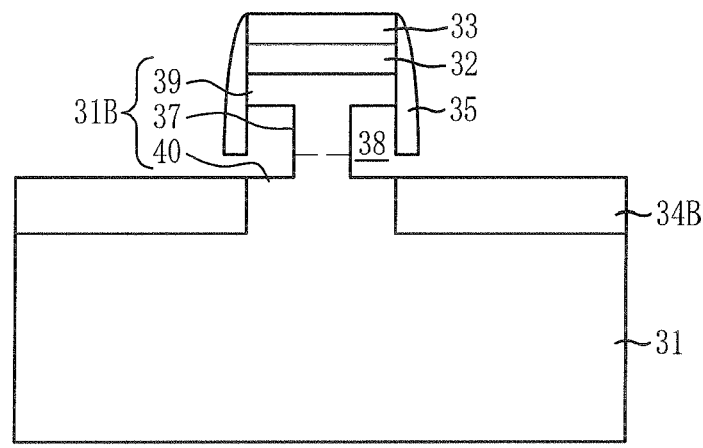

Referring to FIG. 3E, an etching process is performed on a second resultant structure. The etchant used has a characteristic, which etches the substrate 31 more than the material to define a neck/pillar 37. As a result, the fin active region 31B has a laterally recessed portion 38 on opposite sides. The fin active region 31B has an upper portion, a middle portion and a lower portion. In other words, the fin active region 31B has a head 39, a pillar 37, and a body 40. The body 40 is defined by the lower portion of the fin active region 31B that remains after the etch process. In this manner, a surface area of the fin active region 31B is enlarged. Enlarging of the surface area of the fin active region 31B represents enlarging of a subsequent channel region. As will be well appreciated, an etching rate and an etching profile during the dry etching process on the fin active region 31B may be controlled by varying the etch parameters. As a result, the pillar (or neck) may be provided with different shapes. (See FIG. 4.)

In one embodiment, the substrate 31 includes an amorphous silicon. The dry etch process uses hydrogen chloride (HCl) as an etchant to selectively etch the amorphous silicon. A mixture of HCl and hydrogen ($H_2$) can be also be used as an etchant. Other etchants may be used accordingly to implementations. In one embodiment, the dry etching process is performed at a pressure ranging from approximately 2 Torr to approximately 200 Torr, at a flow ratio of HCl ranging from approximately 0.1 slm to approximately 1 slm, at a flow ratio of $H_2$ ranging from approximately 10 slm to approximately 50 slm and at a temperature ranging from approximately 700° C. to approximately 1,000° C. and is performed within approximately 0.5 minute to approximately 60 minutes. The etching rate and the etch profile may be controlled by adjusting the etch parameters. Prior to the performing the vapor etching process, a thermal treatment may be performed in a hydrogen atmosphere and at a temperature ranging from approximately 800° C. to approximately 1,000° C. in order to perform the dry etching process safely by removing a resultant on the exposed portion of the fin active region 31B.

Figure 3F:
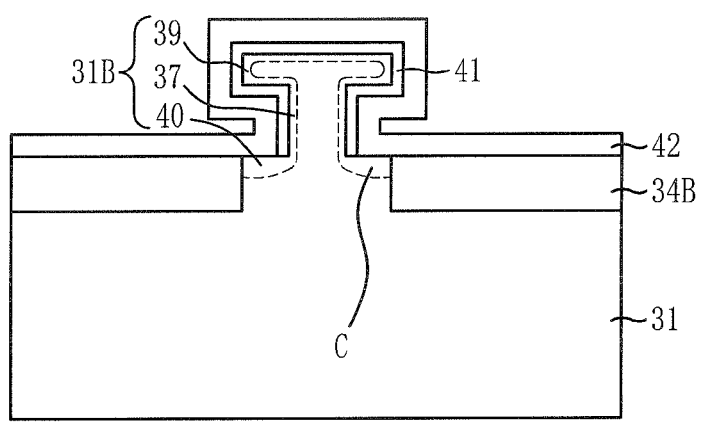

Referring to FIG. 3F, a gate insulation layer 41 is formed along the pillar 37 and the head 40 of the exposed selectively etched fin active region 31B after removing the pad oxide layer 32, the pad nitride layer 33 and the spacers 35. A conductive layer for a gate electrode is formed over the gate insulation layer and the remaining isolation layer 34B, the conductive layer is patterned thus, a gate electrode 42 crossing the selectively etched fin active region 31B is formed. The conductive layer includes a polysilicon. A channel region C is formed along the portion of the selectively etched fin active region 31B covered with the gate electrode 42. Thus, the surface area of the fin active region 31B is increased and current path along the channel region C is also increased.

Figure 4:
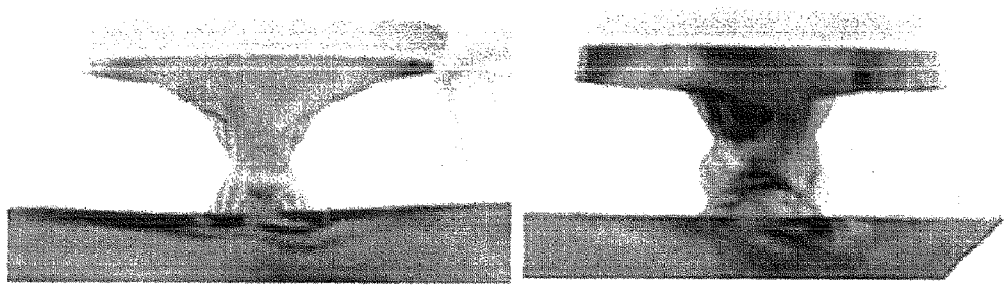
FIG. 4 illustrates micrographic views of an etch profile after an etching on a fin active region in a transistor in accordance with an embodiment of the present invention.

FIG. 4 illustrates micrographic views of an etch profile after the pillar has been formed on a fin active region in a transistor in accordance with an embodiment of the present invention.

As described above, a channel region of a transistor in accordance with the described embodiments can be enlarged significantly due to sidewalls of a fin active region having a neck/pillar.

While the present invention has been described with respect to the specific embodiments, the above embodiment of the present invention is illustrative and not limitative. It will be apparent to those skilled in the art that various changes and modifications may be made without departing from the spirit and scope of the invention as defined in the following claims.

What is claimed is:

1. A method for fabricating a transistor, the method comprising:

forming a trench by partially etching a substrate to form a fin active region that protrudes vertically from the substrate;

forming an isolation structure around a lower portion of the fin active region while exposing an upper portion of the fin active region;

forming spacers on the upper portion of the fin active region;

partially removing the isolation structure under the spacers to expose a portion of sidewalls of the fin active region; and etching the exposed portion of the sidewalls of the fin active region so that the fin active region defines an upper region, a middle region, and a lower region, the middle region being thinner than the upper region, wherein the etching process is a dry etch process using hydrogen chloride (HCl) as an etchant and exposes an uppermost surface of the lower region, side surfaces of the middle region, and a bottom surface of the upper region, a height of the uppermost surface of the lower region being equal to a height of a resulting upper surface of the isolation structure after said act of etching the exposed portion of the sidewalls of the fin active region.

2. The method of claim 1, wherein further comprising, forming a pad nitride layer over the fin active region.

3. The method of claim 1, wherein forming the isolation structure comprises filling in the trench with an isolation layer and etching the isolation layer to have a given thickness.

4. The method of claim 3, wherein the thickness of the etched isolation layer defines the lower portion of the fin active region.

5. The method of claim 3, wherein etching the isolation layer to have the given thickness is performed for a portion of the isolation layer corresponding to a target region where a gate electrode is formed.

6. The method of claim 1, wherein the spacers include a nitride layer.

7. The method of claim 1, wherein a wet etching process is performed to partially remove the isolation structure.

8. The method of claim 1, wherein the etching process is performed by using an enchant that etches the substrate faster than the spacer or the isolation structure.

9. The method of claim 8, wherein the etching process is performed at a temperature ranging from approximately 700° C. to approximately 1,000° C.

10. The method of claim 8, wherein the etching process is performed at a pressure ranging from approximately 2 Torr to approximately 200 Torr.

11. The method of claim 8, wherein the etching process is performed for approximately 0.5 minute to approximately 60 minutes.

12. The method of claim 1, wherein the etching process uses a mixture of HCl and hydrogen ($H_2$) as an etchant.

13. The method of claim 12, wherein the HCl has a flow ratio ranging from approximately 0.1 slm to approximately 1 slm and the $H_2$ has a flow ratio ranging from approximately 10 slm to approximately 50 slm.

14. The method of claim 1, further comprising, prior to performing the etching, performing a thermal treatment on the fin active region.

15. The method of claim 14, wherein the thermal treatment is performed at a temperature ranging from approximately 800° C. to approximately 1,000° C. and in an hydrogen ($H_2$) atmosphere.

16. The method of claim 1, further comprising, after performing the vapor etching process:

forming a gate insulation layer on a surface of the fin active region and forming a gate electrode crossing the fin active region and covering a portion of the fin active region.

* * * * *